(12) United States Patent
Selvaggi

(10) Patent No.: US 11,175,320 B2
(45) Date of Patent: Nov. 16, 2021

(54) SYSTEM AND METHOD FOR ELECTRICAL POWER AND/OR ENERGY METERING ON MULTIPLE CHANNELS

(71) Applicant: tiko Energy Solutions AG, Bern (CH)

(72) Inventor: Yuri Selvaggi, Zürich (CH)

(73) Assignee: TIKO ENERGY SOLUTIONS AG, Bern (CH)

( * ) Notice: Subject to any disclaimer, the term of this patent is extended or adjusted under 35 U.S.C. 154(b) by 0 days.

(21) Appl. No.: 17/261,930

(22) PCT Filed: Aug. 13, 2019

(86) PCT No.: PCT/EP2019/071753
§ 371 (c)(1),
(2) Date: Jan. 21, 2021

(87) PCT Pub. No.: WO2020/035507
PCT Pub. Date: Feb. 20, 2020

(65) Prior Publication Data
US 2021/0247424 A1   Aug. 12, 2021

(30) Foreign Application Priority Data
Aug. 14, 2018   (CH) ........................................ 985/18

(51) Int. Cl.
*G01R 19/25* (2006.01)
*G01R 21/133* (2006.01)
*G01R 22/06* (2006.01)

(52) U.S. Cl.
CPC ..... *G01R 19/2513* (2013.01); *G01R 19/2516* (2013.01); *G01R 21/133* (2013.01); *G01R 22/063* (2013.01)

(58) Field of Classification Search
CPC .... G01R 22/00; G01R 22/061; G01R 22/063; G01R 22/065; G01R 21/133;
(Continued)

(56) References Cited

U.S. PATENT DOCUMENTS 5,834,932 A * 11/1998 May ...................... G01R 11/04
324/107
2005/0083206 A1* 4/2005 Couch .................. G01R 21/133
340/657
(Continued)

FOREIGN PATENT DOCUMENTS

EP   2784449 A2   10/2014
GB   2452989 A    3/2009
(Continued)

OTHER PUBLICATIONS

Kamat, Efficient Energy Harvesting using Current Transformer for Smart Grid Application, Apr. 2018, IEEE (Year: 2018).*
(Continued)

*Primary Examiner* — Giovanni Astacio-Oquendo
*Assistant Examiner* — Dustin R Dickinson
(74) *Attorney, Agent, or Firm* — Pearne & Gordon LLP

(57) ABSTRACT

A system (10) for power and/or energy consumption metering on an AC powerline network (1) supplying a plurality of channels ($C_1, C_2, \ldots, C_n$) with a respective electrical load ($L_1, L_2, \ldots, L_n$), comprising:
A central unit (11) connected to the AC powerline network (1), comprising a single central voltmeter (110) supplied by a power supply unit (112);
A plurality of clamped-on units (12), distributed over each channel ($C_1, C_2, \ldots, C_n$) to be measured, each clamped-on unit (12) being clipped around existing cables, and comprising a current transformer (120) in order to measure current values
The plurality of clamped-on units (12) are connected to the central unit (11) for data transmission and synchronization, and for power supply by the power supply unit (112).

11 Claims, 4 Drawing Sheets

(58) Field of Classification Search
CPC .. G01R 19/2513; G01R 19/2516; H02B 1/03; Y02B 90/20; Y02B 70/30; Y02B 20/40; H01H 2300/03; Y04S 10/18; Y04S 20/30
See application file for complete search history.

(56) References Cited

U.S. PATENT DOCUMENTS

2005/0285602 A1* 12/2005 Field ..................... G09G 3/006
                                                              324/529
2016/0313744 A1* 10/2016 Amelio .................. B64C 27/08

FOREIGN PATENT DOCUMENTS

| JP | 2001298877 A | 10/2001 |
| TW | 201337278 A | 9/2013 |
| WO | 2015102605 A1 | 7/2015 |

OTHER PUBLICATIONS

International Search Report & Written Opinion in PCT/EP2019/071753, dated Sep. 20, 2019, 6 pages.
International Preliminary Report on Patentability (IPRP), and its annexes, in PCT/EP2019/071753, dated Sep. 23, 2020, 32 pages.

* cited by examiner

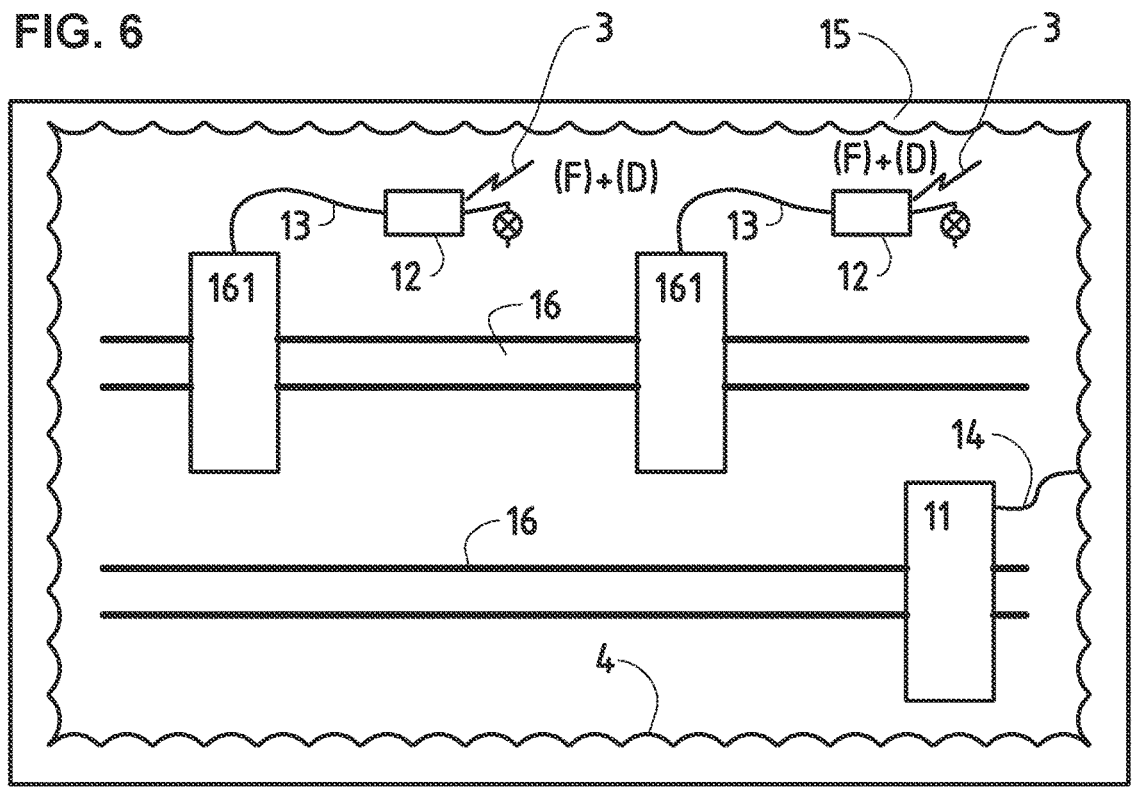
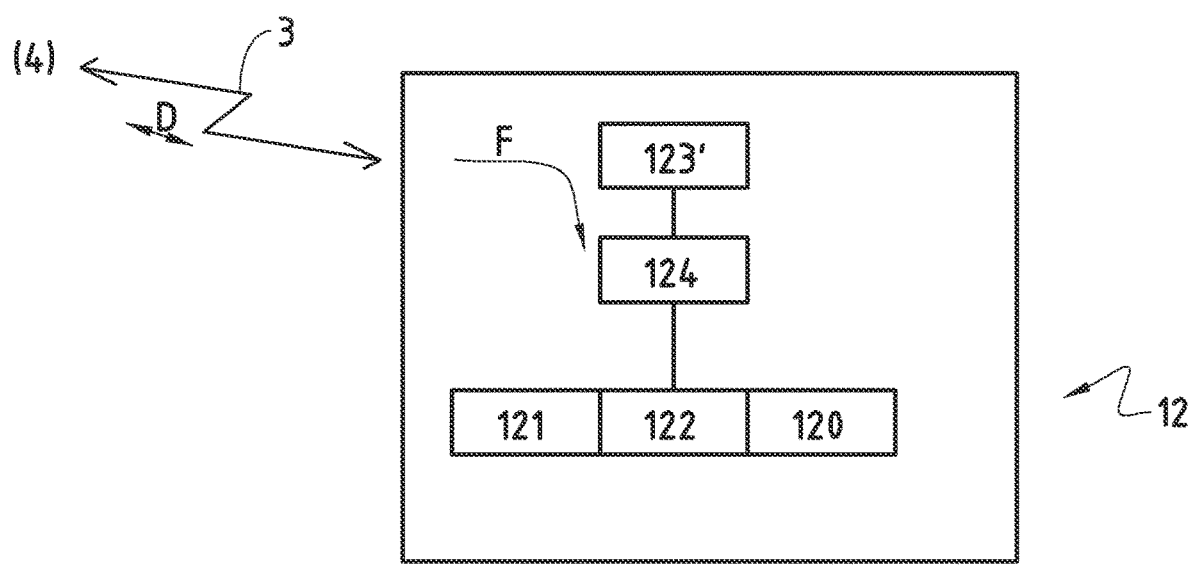

SYSTEM AND METHOD FOR ELECTRICAL POWER AND/OR ENERGY METERING ON MULTIPLE CHANNELS

TECHNICAL FIELD

The invention relates to the field of energy metering and more specifically to the field of electrical power and energy metering.

BACKGROUND

Power and/or energy metering on AC main loads can serve several purposes which range from billing to energy-consumption's customer-awareness. In any household, office or industry, energy is supplied to run lighting, tools, PCs, machineries and any other kind of device which requires energy.

In order to make a better usage of energy, the concept of customer-awareness is now gaining momentum.

Several solutions are already on the market to enable the user to sub-measure (measuring after the main counter used for billing by the energy supplier) selected loads. Smart-plugs are, among them, a simple way to measure a single load. This kind of meters don't have to withstand with any special regulation (beside e.g. standard default regulations for the European Community as far as markings are concerned) nor with any specific accuracy thus don't they require any certification.

Electrical network balancing service providers (e.g.: load control, load shift, load balance, load management) need to measure electrical flows (consumption and/or supply) with high accuracy and they tend to adopt either certified off-the-shelf energy meters or certified custom-made energy meters. Meters have to be certified against metrological standards and they have a relatively high TCO (total cost of ownership) per measured line (channel).

Typical accepted accuracy is in the order of 0.5% to 1% (maximum measure error in most of their measure's range).

In order to measure energy consumption (in watt-hour) it is necessary to measure voltage (V) and current (I) and to integrate V and I values giving instant power values in watts over time. By using standard calculation it is possible to determine, among others, values of real, reactive and apparent power. This calculation is usually accomplished by a DSP (Digital Signal Processor).

The sampling of the voltage and current are handled by low noise, high resolution ADCs (Analog to Digital Converter).

While voltage is measured by physically connecting wires to neutral and phase lines, current can be measured using different approaches. Among them are two main options:

Shunts: a small value resistor (usually in tenths of milliohm) in series to the load. The creation of yet additional galvanic contacts required their mounting is yet quite intrusive and fastidious, since it requires cutting the wires and having the whole current going through the metering device. Due to Joule effect, this produces a lot of heating, and also some energy loss; as result, this metering option is usually not privileged;

Current Transformers: these devices are made of a coil to be mounted around an existing wire carrying the current, and that represents the secondary winding of a transformer. Current measure is then obtained by measuring on the secondary winding, which is, as opposed to the previous option, galvanically isolated, tolerant to overloads, and non-intrusive. This provides several advantages in terms of electrical safety, and ease of installation, since they can be easily clipped around an existing wire, not requiring any intervention on the existing installation. Therefore, current transformers are preferred over shunts. "Rogowski coils", which are a variant of current transformers, are intended for very high current. Both, are widely implemented.

Yet it is extremely important that there is no phase shift between the measure of V and I in order to achieve high accuracy.

Therefore, when there is the need or the will to measure more than a channel, then either multiple meters are used, or a multi-channel energy meter which has a predefined number of channels may be used, such as the reference bfm 136 of Satec (See Satec-global.com.au) that is suitable for twelve 3-phase channels. However, this kind of apparatus requires a lot of physical space in the electrical panel (in this example, 107×331×58 mm, for 1.85 Kg), is not easy to install, and does not scale well at all.

In view of the above, it does not seem possible to accurately measure a plurality of channels in a cheap way, with an acceptable level of accuracy, due to the high deployment cost that are required in order to enable a deeper penetration and finer granularity with respect to the household appliances that are used.

Patent document TW201337278 describes a power sensor for power measurement fitted with synchronization mechanism for measuring the current flow at the power sensor side. This purely cable-based solution results in a complex wiring though. In contrast, patent document EP2784449 discloses a distributed metering system using current transformers, wherein the power metering is realized through dedicated modules assigned to a node, and wherein measurement data can be transmitted wirelessly. Each of the modules used in the metering process needs yet an own dedicated power source.

The international patent application PCT2015/102605 discloses another solution using so-called "smart CTs", i.e. clamped current transformers, wherein the sampling of raw current data is forwarded from the smart sensors to a primary microcontroller for centralized processing, possibly in a wireless manner, while the communication between the current transformers is still performed according to a daisy-chained scheme. As a result, here again the cabling issues may arise.

GB2452989 shows another solution involving a decentralized processing scheme for power metering, using various DSPs (digital signal processors) assigned to each current sensor. Here again, heavy cabling is necessary to supply power to each of the DSPs.

JP2001298877 shows another solution of a clamp-based power monitoring apparatus, involving a series of current detection means connected through cables to a central wattmeter for power computing.

As a result, there is a need for a new power and/or energy meter system free of at least some if not all of the above mentioned limitations.

SUMMARY

An object of the present invention is to unveil a system and method for measuring a virtually unlimited number of channels, while keeping the same level of accuracy as the one of meters currently used for billing or network-balancing.

Another object of the present invention is to lower the total cost of ownership (TCO) including the device and installation costs, as well as minimizing space requirements inside electrical panels.

To this end, the present invention concerns a system for power and/or energy consumption metering on an AC powerline network supplying a plurality of channels with a respective electrical load, comprising:

A central unit connected to the AC powerline network, comprising a single central voltmeter supplied by a power supply unit;

A plurality of clamped-on units, distributed over each channel to be measured, each clamped-on unit being clipped around existing cables of the AC powerline network, and comprising a current transformer in order to measure current values;

wherein the plurality of clamped-on units is connected to the central unit for data transmission and synchronization, and for power supply by the power supply unit of the central unit, characterized in that a wireless link is provided between the plurality of clamped-on units and the central unit, wherein the clamped-on units are mounted on an electrical panel, and wherein an induction coil is further provided around this electrical panel for power transmission to said clamped-on units, and data transmission to and from said clamped-on units.

An advantage conferred by the claimed solution is that the new proposed system is very easy to install, light and scalable, and while yet providing reliable measurements.

Another advantage of the presented solution is that the cost per channel decreases in linear way at the increasing of the number of channels: the more the channels, the less the cost per channel.

According to yet another preferred embodiment, a wireless link is provided between the plurality of clamped-on units and the central unit.

An advantage of the fact that a wireless link is provided between the plurality of clamped-on units and the central unit is that, due to the fact that no more cabling is needed for the mutual interconnection of the clamped-on units, a better overview is granted on the electrical panel and space beside clamp-on devices that would have been hardly accessible behind cables can be made available.

According to a variant of the latter preferred embodiment, the clamped-on units are mounted on an electrical panel and an induction coil is further provided around the electrical panel for power transmission to the clamped-on units, and data transmission to and from said clamped-on units.

An advantage of the fact that the clamped-on units are mounted on an electrical panel and an induction coil is further provided around the electrical panel for power transmission to the clamped-on units, and data transmission to and from said clamped-on units is that the type of wireless technology that is used serves simultaneously two purposes, i.e. power supply and data transmission, and can be easily installed on the electrical panel with almost no prejudice in terms of space usage. As a result, no more dedicated power supply network is necessary while no power supply units need to be foreseen inside the clamped-on units either, and no more cables are required for data transmission.

According to a preferred embodiment, the AC powerline network supplies one, two or three-phases electrical power, and the single central voltmeter is a voltage ADC system sampling voltage values, for each phase, at frequencies over 100 Hz, and preferably 1 KHz or more, and the clamped-on units sample current values at the same frequency.

An advantage of this preferred embodiment is that the proposed system is fully compliant for use with usual electrical power networks, and that it provides an increased measuring precision.

According to another preferred embodiment, the central unit further comprises at least one communication interface.

An advantage of this preferred embodiment is that the proposed system offers a simple architecture for outputting results to an external network, as well as inputting data from such networks for managing and supervising the metered network loads.

An advantage of this preferred embodiment is that the installation process of all the clamped-on units is quite straightforward, and that their mutual interconnection is realized in a very simple manner.

According to yet another embodiment, each of the clamped-on units are fitted with an embedded digital signal processor for dedicated local computation of the power and/or energy consumption of each channel.

An advantage of this preferred embodiment is that the decentralized processing scheme totally desaturates the data communication network interconnecting the clamped-on units to the central unit. As a result, there is no constraint on the maximum number of clamped-on devices and maximum flexibility is ensured in terms of scalability.

According to yet another embodiment, that serves primarily as an alternative to the previous embodiment, but could also be combined with it for insourcing some computational tasks, but not all of them from the remote units to the central unit, the central unit is fitted with a central digital processor for centralized computation of the energy consumption of each channel.

An advantage of this preferred embodiment is that the centralized processing scheme is more cost efficient than the previous one for a large number of channels to measure; however, the increasing traffic for forwarding measures to be processed centrally may rapidly turn into a limiting factor in terms of scalability.

The present invention also relates to a method for power and/or energy consumption metering on an AC powerline network using the claimed system, wherein voltage values are first measured at the central unit, then current values are measured at the clamped-on units for each channel, yielding instant power values, and eventually energy consumption is then derived by a digital signal processor integrating synchronised voltage and current values, characterized in that a wireless link is provided between the plurality of clamped-on units and the central unit, wherein the clamped-on units are mounted on an electrical panel, and wherein an induction coil is further provided around an electrical panel for power transmission to said clamped-on units, and data transmission to and from said clamped-on units.

An advantage conferred by the claimed solution is that the new proposed method can be easily implemented, and is compliant with any centralized or decentralized processing pattern, whereby the wireless link provided between the plurality of clamped-on units and the central unit allows, thanks to the fact that no more cabling is needed for the mutual interconnection of the clamped-on units, a better overview is granted on the electrical panel and space beside clamp-on devices that would have been hardly accessible behind cables can be made available.

Moreover, owing to the fact that the clamped-on units are mounted on an electrical panel and an induction coil is further provided around the electrical panel for power transmission to the clamped-on units, and data transmission to and from said clamped-on units, the type of wireless technology that is used serves simultaneously two purposes, i.e. power supply and data transmission, and can be easily installed on the electrical panel with almost no prejudice in terms of space usage. As a result, no more dedicated power supply network is necessary while no power supply units need to be foreseen inside the clamped-on units either, and no more cables are required for data transmission.

According to a preferred embodiment for the method according to the present invention, voltage values are sampled at a frequency higher than 100 Hz, and preferably 1 kHz or more, by a voltage ADC system at the central unit, and current values are also sampled at a frequency higher than 100 Hz, and preferably over 1 kHz or more, by a current ADC at each clamped-on unit.

An advantage of this preferred embodiment is that the proposed method provides an increased measuring precision.

According to a yet another preferred embodiment, the sampled voltage values are broadcasted to every clamped-on unit, and power and/or energy consumption for each channel is subsequently computed by an embedded digital signal processor of each clamped-on unit based on sampled current values and the received voltage values.

An advantage of this preferred embodiment using a decentralized processing scheme is the load onto the data network is low and constant, irrespectively of the number of measured channels, as the voltage values are sent to the clamped-on units via broadcast traffic, and therefore this solution scales perfectly irrespective of the number of clamped-on devices.

According to yet another preferred embodiment, the sampled current values are transmitted back to the central unit, and power and/or energy consumption is subsequently computed by a central digital signal processor of the central unit based on the centrally sampled voltage values and the received current values.

An advantage of this preferred embodiment is that it may reduce the bill of material for a high number of clamped-on units, since one single central DSP will, at some point, be cheaper than multiple dedicated DSPs integrated in the clamped-on units. However, the incoming traffic generated for harvesting current measures from each of the clamped-on units makes it scale poorly.

According to a preferred variant embodiment, a preliminary binding process is foreseen to assign a unique identifier to specific channels.

An advantage of this preferred variant embodiment is that it can help efficiently manage the channels that need to be measured. For example, channels corresponding to specific appliances may be grouped according to e.g. a tiered numbering scheme, whose first digit identifies a group/type of devices associated with predefined loads, and the second digit corresponds to the actual device belonging to this group/type.

According to another preferred variant embodiment, contextual information can be provided to each clamped-on unit upon installation and then imported to said central unit. This can be done for example through an application programming interface and the existing communication interface.

An advantage of this preferred variant embodiment is that it allows to easily give a holistic view of the channels that need to be supervised by corresponding clamped-on units in real-time by leveraging the existing infrastructure of the central unit.

BRIEF DESCRIPTION OF THE DRAWINGS

The invention will now be described in greater detail with reference to accompanying figures, in which:

FIG. 6 shows schematically the architecture of a system for power and/or energy consumption metering on an AC powerline network according to the present invention, in which a central unit is wirelessly connected to remote clamped-on units through an inductive coil installed on an electrical panel;

FIG. 7 shows a logical diagram of a clamped-on unit cooperating with the central unit illustrated in FIG. 4, and that is used for implementing a preferred method for the present invention using a centralized processing pattern.

DETAILED DESCRIPTION

In the following, preferred embodiments for the power and/or energy metering system and the method according to the present invention will be described. These exemplary embodiments are given by way of example only, and shall not be construed in a limiting manner.

Figure 1:
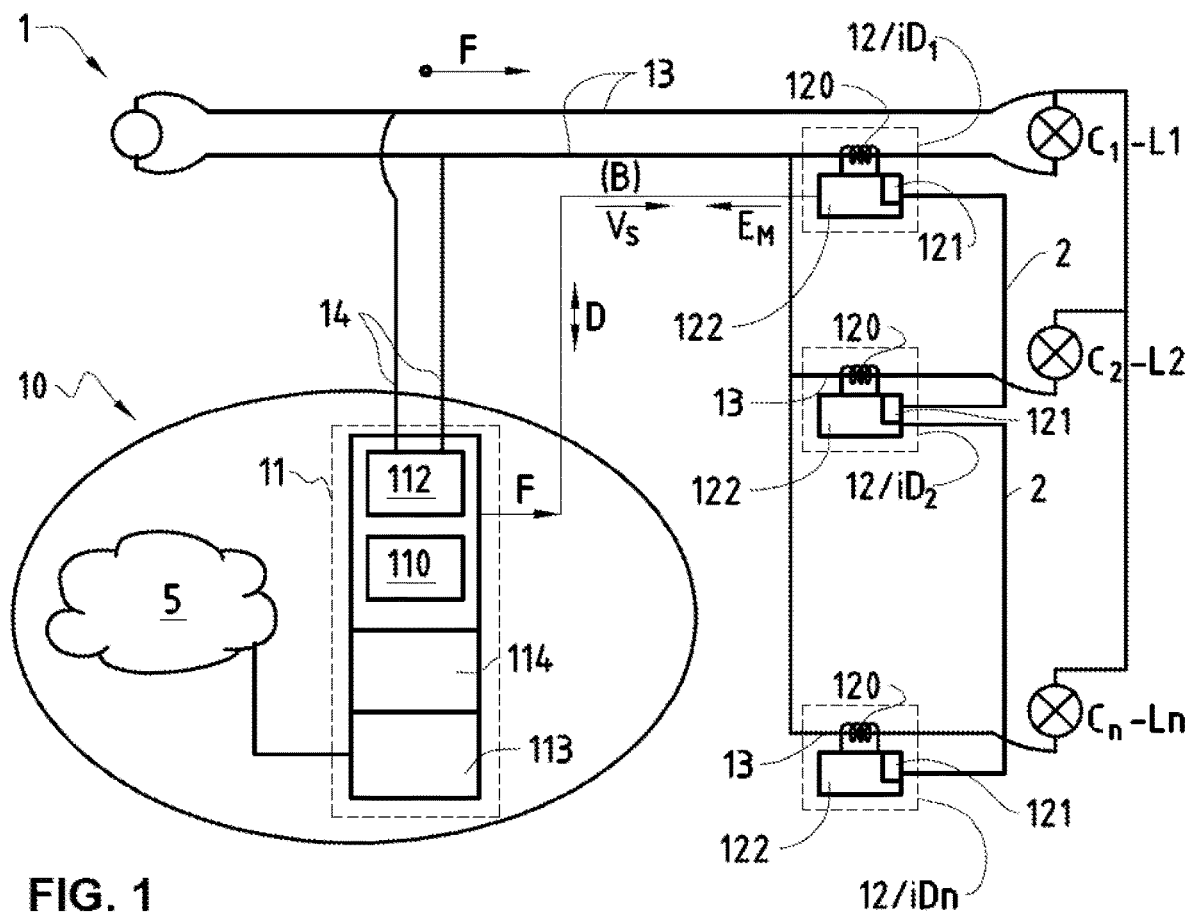
FIG. 1 shows schematically the architecture of a system for power and/or energy consumption metering on an AC powerline network, with a central unit connected to remote clamped-on units through a serial bus.

FIG. 1 show the general architecture of a power and/or energy consumption metering system 10 of an AC powerline network 1 used in the framework of the present invention, and which is made of On the one hand, a central unit 11, connected to the power line network 1 through connecting cables 14, and which is used to:

measure voltage values $V_s$ through a central voltmeter 110;

take energy to supply power to the central unit 11 and to remote current metering devices;

provide one or more wired or wireless communication interface(s) 113 to communicate with an external communication network 5.

On the other hand, a plurality of current metering devices, consisting of clamped-on units 12, equal to the number of channels ($C_1, C_2, \ldots, C_n$) to measure, and that are clipped on existing cables (13) through which the respective loads ($L_1, L_2, \ldots, L_n$) are supplied.

The AC powerline network 1 can typically supply a 50 Hz three-phase electrical power, and the voltage values $V_s$ are then measured for each of the phases. However, it will be understood that the proposed solution works just as well when applied to a single phase network only, as well as a two phase network (available e.g. in the USA).

Power is supplied to the central unit 11 through an integrated power supply unit (PSU) 12 consisting of an integrated AC/DC converter transforming the energy of the powerline into a significantly lower DC voltage. However, small external PSUs could also be foreseen, and even battery supply as a back-up solution. The low voltage levels considered in the framework of the present invention preferably range between 5 and 10 Volts.

As it can be appreciated in further in view of FIG. 1, a digital network cable with integrated power supply such as a serial bus 2 is provided to interact and exchange data as well as power with the clamped-on devices 12. This serial bus 2 is materialized by the fat cable, on which the double sided arrow D shows the bidirectional data transfer flow and the arrow F illustrates the energy supply flow. This allows to easily daisy-chain the remote current meters distributed over the various channels, and makes the installation process quite straightforward. Once installed, the serial bus 2 is capable of delivering the energy required by the clamped-on units 12 to operate.

In order to measure instant power—usually in Watts—and in turn, energy, usually measured in Watt-hour by integrating sampled values of current $I_s$ and sampled voltage values $V_s$. Hence, in order to provide good quality measures, it is necessary to synchronize the current measurements and the voltage measurements in order not to introduce any significant phase shift that would otherwise render power values, and in turn energy values, less precise, or even totally meaningless if the phase shift is becomes too high.

The sampling frequency for the voltage and current values first depends, according to Shannon's Theory, from the frequency of the powerline AC network itself: the minimum sampling rate is set to twice the powerline frequency. Then, the higher the frequency, the better the precision will be, and according to a preferred embodiment, the sampling rate is preferably set to several hundreds of Hertz, and if possible at least equal to 1000 Hz.

In order to be negligible, the phase shift must be less than the period of one sample; then for a sample rate set to 1000 Hz, the phase shift between the voltage and current measures shall be less than 1 ms.

According to the system and method illustrated on FIG. 1, this constraint is met by streaming in real-time each and every sampled voltage values $V_s$ measured by the voltage analog to digital (ADC) system, i.e. of the central voltmeter 110 of the central unit 11, on the serial bus 2 to every clamped-on units 12. Since the order of magnitude for the available data transmission speeds on these digital bus 2 is typically above megabits per second (Mbps), they are totally suitable for sampling rates of 1 kHz and even above. This way, no latency greater than one sample period can ever be achieved at the current measurement devices' side, i.e. when these voltage values $V_s$ reach the clamp-on units 12.

An advantage of the disclosed broadcast transmission scheme of voltage values $V_s$ toward the clamped-on units 12, is that the broadcast flow B stemming from the central unit 11 remains constant, irrespective of the number of clamped-on units 12. As a result, such a system 10 is very scalable.

Still on FIG. 1, it can be appreciated that a decentralized computing scheme is adopted for the calculation of power and energy. Indeed, the central unit 11 is deprived of any digital signal processor (DSP), whereas every clamped-on unit 12 is not only fitted with a current transformer 120, but also with an embedded DSP 121. As a result, it is possible to compute instant power, as well as energy, locally at each clamped-on unit 12, and then transmit these yielded values back to the central unit 11. According to the preferred embodiment illustrated on FIG. 1, reports $E_m$ on power/energy metered are periodically sent back at a lower frequency, typically ranging between 1 Hz and 10 Hz, in order not to create too much traffic load on the digital bus 2. These reports $E_m$ can then be stored in a local memory unit 114 and also periodically forwarded to an external communication network 5 through a communication interface 113 (such as typically: RS-232, RS-485, ModBus, Ethernet or any other kind of standard wired or wireless interface, including customized interfaces) for further processing or analysis.

The central unit 11 typically allocates a set of internal registers of its memory unit 114 for each clamped-on unit 12 connected (e.g.: Overall Counter Register in Kwh, active/reactive/apparent instant power values, voltage, current, frequency among others). Each time the central unit 11 receives an update from any clamped-on unit 12, it will update the registers linked to that specific clamped-on unit 12 accordingly.

On the right side of FIG. 1, it can be appreciated that each of the clamped-on units 12 is allocated with a specific identifier $ID_1$, $ID_2$, ..., $ID_n$, which can be matched to specific channels $C_1$, $C_2$, ..., $C_n$ according to a predefined matching scheme (e.g. specific loads, appliance types, etc.). A tiered scheme numbering can also be considered in order to provide a logical overview of the supervised network. During the deployment phase of the clamped-on units 12, a software assisted binding process can be performed, wherein contextual information could be entered, name tagging for the load of the corresponding channel to measure as well as any other relevant contextual information could be entered at this stage. This would make their configuration process very easy, and user-friendly, while providing relevant inputs for subsequent management and operational purposes.

Figure 2:
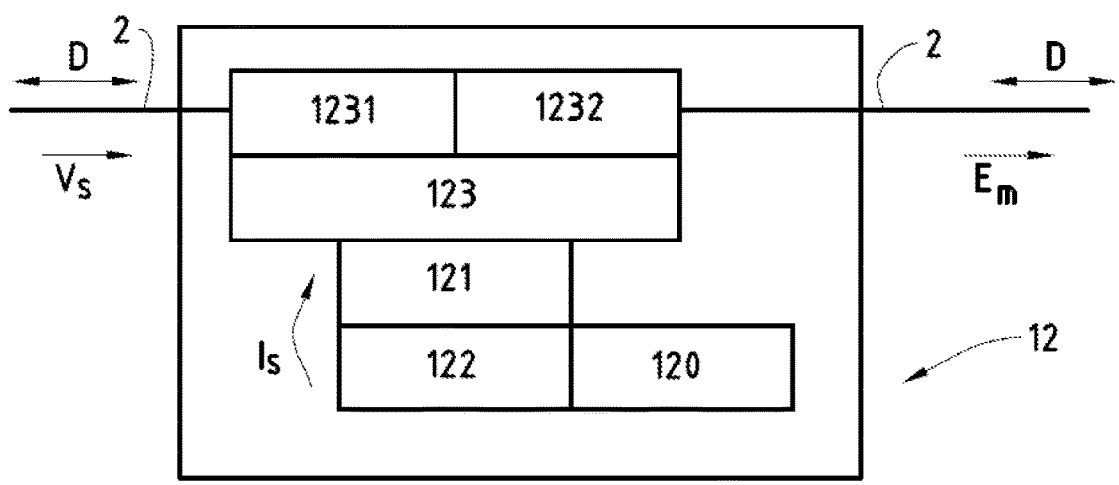
FIG. 2 shows a logical diagram of a clamped-on unit cooperating with the central unit illustrated in FIG. 1, and that is used for implementing a preferred method for the present invention using a decentralized processing pattern.

FIG. 2 shows the logical structure of a clamped-on unit 12, connected to the serial bus 2, and that receives the voltage information.

Each clamped-on unit is made of:
A current Transformer 120, or a Rogowsky-coil, that is placed/clipped around the existing cable of the channel to be measured;
A current ADC circuit 122 to sample at high speed the current values Is;
A embedded DSP 121 which makes the integration of the current values locally measured and the voltage values $V_s$ broadcasted by the central unit 11;
A serial interface 123 to the serial bus 2 in order to exchange data with the central unit. The serial interface 123 comprises an input 1231, over which the voltage values Vs are received, and an output 1232, over which the measure reports $E_m$ on power/energy metered are sent.

Figure 3:
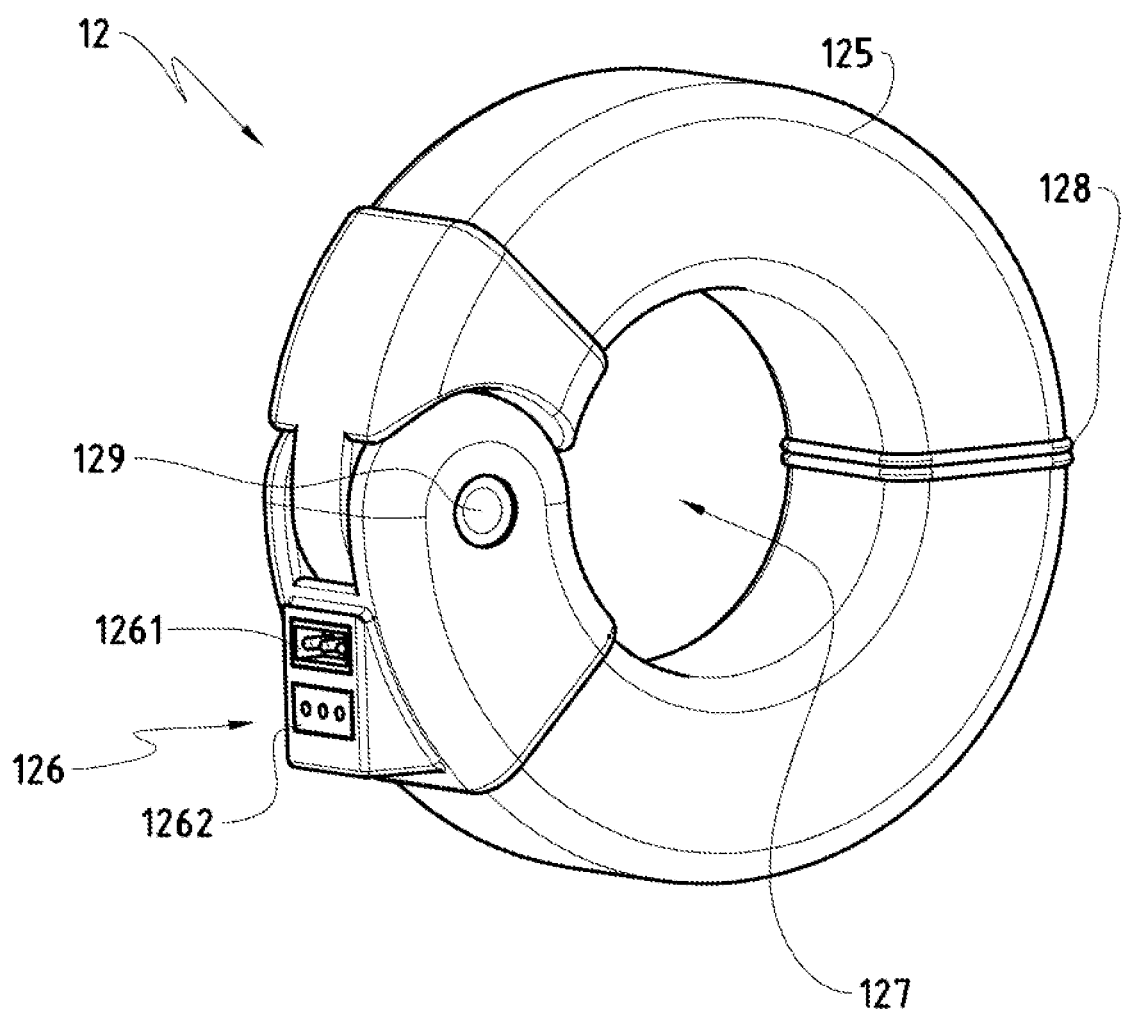
FIG. 3 shows a physical structure of a clamped-on unit, in which they are connected to a central unit through a serial bus.

As shown in FIG. 3, the clamped-on units 12 can be small enough to be formed as an integral one-piece element, including all the electronics, the connectors 126 (input plug 1261 and output plug 1262, each comprising three pins in the disclosed example where they are implemented as standardized three pin connectors, two of which being used for power transmission and the last one for data) and the current transformer 120, that is here concealed inside the outer casing ring 125. However, it will be understood that according to variant embodiments, a four wire implementation could be considered for the serial bus and the current transformer could also be at least partly inside the casing ring 125. The ring shaped clamped-on unit 12 comprises a central opening 127 for accommodating the cable, and a radial opening 128 for letting it through. Two parts on either side of the radial opening are movable around a hinge 126;

they are first moved away from each other, and then brought back together when performing the clipping operation over the cable.

Figure 4:
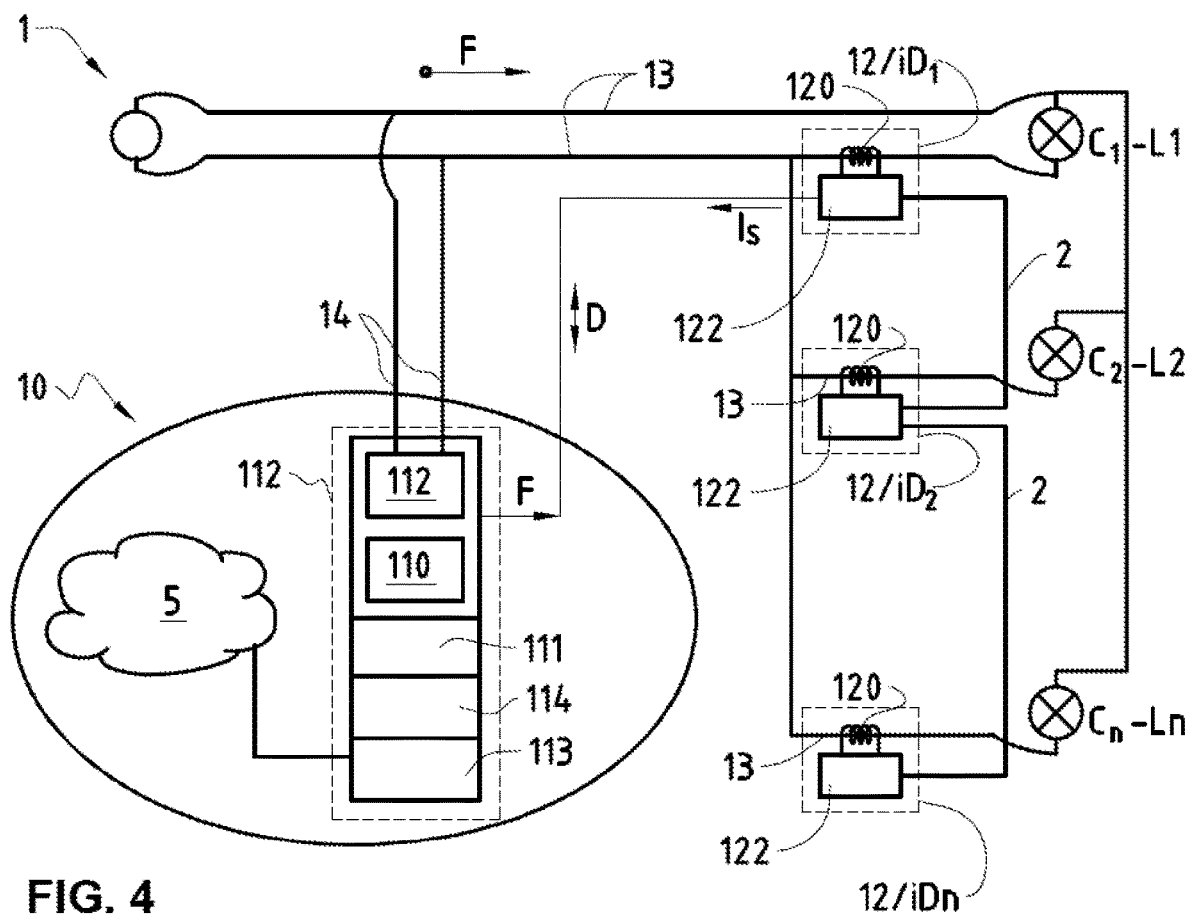
FIG. 4 shows schematically the architecture of a system for power and/or energy consumption metering on an AC powerline network, with a central unit still connected to remote clamped-on units through a serial bus.
Figure 5:
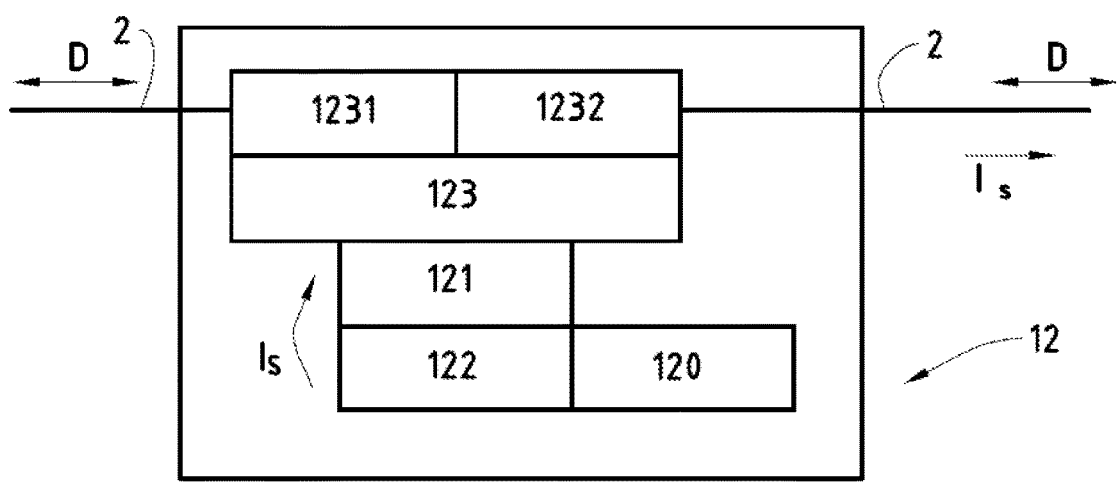
FIG. 5 shows a logical diagram of a clamped-on unit cooperating with the central unit illustrated in FIG. 4, and that is used for implementing a preferred method for the present invention using a centralized processing pattern.

In the following, reference will be made jointly to FIGS. 4 and 5 illustrating another system and method, using now a centralized processing scheme. While describing these figures, references that have already been introduced and are redundant with previously discussed figures such as FIGS. 1 and 2 will be omitted.

In this alternative version, there is an off-load of the computational power from the clamped-on units 12, that do not have any embedded DSP 121 anymore, towards the central unit 11, that is now fitted with a central DSP 111, whereas it had none in the previously described version.

In this version, the clamped-on units 12 thus roughly contain only the elements to measure the current, such as the current ADC converter 122 (see FIG. 5). Since there is no more embedded DSP, the sampled values of current $I_s$ are forwarded from the clamped-on unit 12 without any further processing towards the central unit 11, which has a central DSP 111 powerful enough to perform the integration for a maximum predefined number of clamped-on unit 12 that the system can support (see FIG. 4, where the central DSP 111 is the only structural difference between a central unit 11 according to this preferred embodiment compared to the one currently described).

However, the now centralized processing scheme strongly affects the data flows F transmitted over the serial bus 2, since there are no more reports $E_m$ on power/energy metered sent back at low frequency (i.e. between 1 Hz and 10 Hz), but instead now an intensive harvesting traffic flowing from each clamped-unit 12 towards the central unit 11, because each of the clamped-on unit 12 now needs to transmit its current information at high speed (i.e. >1 KHz) for the sake of synchronization purposes with the sampling of the voltage values $V_s$.

As a result, the two approaches can be compared as follows:

With an embedded DSPs 121 on the clamped-on units 12 (as illustrated in FIGS. 1&2), there is an almost constant traffic generated on the serial bus 2; therefore, the system scales perfectly and virtually an unlimited number of clamps can be added;

In contrast, with a central DSP 111 installed inside the central unit (as illustrated in FIGS. 4&5), the traffic generated on the serial bus 2 increases for each added clamped-on unit 12. Therefore, there is limited number of maximum clamped-on unit 12 that can be used simultaneously. However, this latter approach offers a cheaper BOM (Bill Of Materials) for a high number of channels, since the bigger central DSP 111 will, at some point, cost less than the plurality of smaller embedded DSPs 121 of the clamped-on units 12.

Irrespective of the processing scheme that is chosen, i.e. centralized or decentralized, it also possible to use a different transmission mode between the remote clamped-on units 12 and the central unit. In other words, it is possible to turn the serial bus 2 using physical wires into a wireless communication link 3.

In the following, a preferred embodiment using wireless transmission will be described, in conjunction with a decentralized processing scheme.

In this embodiment, illustrated on FIGS. 6 and 7, the data transmission link between the clamped-on units 12 and the central unit 11 is wireless, using short-range radio technology granting also up to several Mpbs or tens of Mbps within several meters. Moreover, just like the serial bus 2 in the previous wired embodiments, power could also be wirelessly transmitted to the clamped-on units 12.

Indeed, as illustrated on FIG. 6, the proposed solution uses a single induction coil 4 positioned around the boundaries of an electrical panel 15, on which all clamped-on units 12 are mounted, for joint power and data transmission. This is made thanks for the fact that the induction coil surrounds all the clamped-on units 12. This induction coil 4 is connected to the central unit 11 through merely a further pair of interconnection wires 14, while the central unit 11 positioned on a regular DIN rail 16 can present substantially same structure and wiring scheme to the AC powerline network as in the previous embodiment of FIG. 1 (i.e. just 2 wires to take energy and measure voltage). The only functional element that would need to be added is a DC/AC converter (not shown) connected to the PSU 112 of the central unit 11 in order to drive the induction coil 4.

As illustrated on FIG. 7, on the clamped-on unit's 12 side, the logical elements would include a wireless interface 123' instead of the serial interface 123 used previously, and the energy flow F for power supply can be realized thanks to an additional integrated AC/DC converter 124 allowing for the embedded DSP 121, the current transformer 120 and the current ADC 122 to work properly.

As illustrated back on FIG. 6, an energy flow F can be pushed to the clamped-on units 12 through the wireless link 3 provided, while the bidirectional data flow D consists of a stream of voltage values $V_s$ from central unit 11 down to the clamped-on units 12, and of an opposite traffic coming back from the clamped-on units 12 including the reports $E_m$ on power/energy metered. The synchronization constraints exposed before in the framework of the wired embodiments illustrated by previous FIGS. 1-5 remain unchanged, and are also fully supported here, in the view of the available bandwidth for data transmission on the wireless link.

According to this wireless embodiment, all the clamped-on units 12 are now working as standalone devices, without any cable connection; they just have to be clipped onto the existing cable 13 of the AC powerline network 1 corresponding to the channel on which the load is to be measured. Thus, a hitherto complex installation process from several hours can be brought down to a couple of minutes, which saves a lot of manpower expense. Moreover, since there is no more daisy-chaining, there is less interlocking risk between cables and more space is available on the electrical panel 15, that can remain fairly neat thanks to the minimal wirings.

The system and method described here above allow to have only one voltage meter and an arbitrary number of coils to measure the same arbitrary number of channels, and offer a very straightforward deployment scheme, while minimizing space requirements in the electrical panel (e.g. 2 DIN units: 38 mm wide).

As far as the centralized processing scheme concerned, the number of channels is not pre-determined and virtually unlimited. At any point in time it is possible to add any other arbitrary number of channels, by just plugging-in new ones, so that any installation's upgrade is easy and can be considered without major upfront costs due to threshold effects.

The man with ordinary skill in the art will understand that the above-described embodiments and variants may be combined with each other as appropriate, and in particular that the wired and wireless transmission options between the central unit and the distributed clamped-on units are compliant with both centralized and decentralized processing schemes, and that it would for example also be possible to share the processing load on a central processor of the central unit and remote embedded processors of the clamped-on units if necessary.

Another possible further improvement for the deployment of the system could be to streamline the installation process of the clamped-on units installing them one at a time with the help of an assisting software. After each connection to the central unit, the software will recognize a new clamped-on unit through its identifier and may ask for configuring a load name and/or any further supported details.

In the case of the wireless version, the clamped-on units can thus be inserted in the electrical panel and configured one by one. This operation can be repeated for each clamped-on device to be added to the system.

Apart from the above and without departing from the scope of the claims of the present invention, it is also possible to replace components of the above-described embodiments by other well-known components as appropriate.

The invention claimed is:

1. System for power and/or energy consumption metering on an alternating current (AC) powerline network, said network supplying a plurality of channels with a respective electrical load, the system comprising:
   A central unit connected to said AC powerline network, said central unit comprising a single central voltmeter and a power supply unit, said central voltmeter being supplied by the power supply unit;
   A plurality of clamped-on units, distributed over each channel to be measured, each clamped-on unit being clipped around existing cables of said AC powerline network, and comprising a current transformer in order to measure current values,
      wherein said plurality of clamped-on units are connected to the central unit for data transmission and synchronization, and for power supply by said power supply unit,
      wherein a wireless link is provided between the plurality of clamped-on units and the central unit, wherein said clamped-on units are mounted on an electrical panel, and wherein an induction coil is further provided around said electrical panel for power transmission to said clamped-on units, and data transmission to and from said clamped-on units.

2. System for power and/or energy consumption metering on an AC powerline network according to claim 1, wherein said AC powerline network supplies one, two or three-phase electrical power, and said single central voltmeter is a voltage analog-to-digital converter (ADC) system sampling voltage values, for each phase, at frequencies over 100Hz, preferably over 1KHz, and wherein said clamped-on units sample current values at the same frequency.

3. System for power and/or energy consumption metering on an AC powerline network according to claim 1, wherein said central unit further comprises at least one communication interface.

4. System for power and/or energy consumption metering on an AC powerline network according to claim 1, wherein each of said clamped-on units are fitted with an embedded digital signal processor for dedicated local computation of the energy consumption of each channel.

5. System for power and/or energy consumption metering on an AC powerline network according to claim 1, wherein said central unit is fitted with a central digital processor for centralized computation of the energy consumption of each channel.

6. Method for power and/or energy consumption metering on an AC powerline network using the system according to claim 1, wherein voltage values are first measured at the central unit, then current values are measured at the clamped-on units for each channel, yielding instant power values, and eventually energy consumption is then derived by a digital signal processor integrating synchronised voltage and current values, wherein a wireless link is provided between the plurality of clamped-on units and the central unit, wherein said clamped-on units are mounted on an electrical panel, and wherein an induction coil is further provided around said electrical panel for power transmission to said clamped-on units, and data transmission to and from said clamped-on units.

7. Method for power and/or energy consumption metering on an AC powerline network according to claim 6, wherein voltage values are sampled at a frequency higher than 100 Hz, and preferably over 1 kHz, by a voltage ADC system at the central unit, and current values are also sampled at a frequency higher than 100 Hz, and preferably over 1 kHz, by a current ADC at each clamped-on unit.

8. Method for power and/or energy consumption metering on an AC powerline network according to claim 7, wherein said sampled voltage values are broadcasted to every clamped-on unit, and power and/energy consumption for each channel is subsequently computed by an embedded digital signal processor of each clamped-on unit based on sampled current values and received said sampled voltage values.

9. Method for power and/or energy consumption metering on an AC powerline network according to claim 7, wherein said sampled current values are transmitted back to the central unit, and power and/or energy consumption is subsequently computed by a central digital signal processor of the central unit based on the centrally sampled voltage values.

10. Method for power and/or energy consumption metering on an AC powerline network according to claim 6, wherein a preliminary binding process is foreseen to assign a unique identifier to specific channels.

11. Method for power and/or energy consumption metering on an AC powerline network according to claim 10, wherein contextual information can be provided to each clamped-on unit upon installation and then imported to said central unit.

* * * * *